United States Patent [19]

Janta et al.

[11] Patent Number: 5,003,272
[45] Date of Patent: Mar. 26, 1991

[54] CIRCUIT ARRANGEMENT FOR SYNCHRONIZING A FREQUENCY-CONTROLLABLE OSCILLATOR

[75] Inventors: Dieter J. Janta, Hamburg; Winfried B. Jansen, Ellerbek, both of Fed. Rep. of Germany

[73] Assignee: U.S. Philips Corporation, New York, N.Y.

[21] Appl. No.: 352,446

[22] Filed: May 16, 1989

[30] Foreign Application Priority Data

May 17, 1988 [DE] Fed. Rep. of Germany ....... 3816696

[51] Int. Cl.$^5$ ................... H03L 7/087; H03L 7/113
[52] U.S. Cl. ........................................ 331/11; 331/14; 331/17; 331/18; 331/25
[58] Field of Search ............... 331/4, 8, 10, 11, 14, 331/17, 18, 25, DIG. 2

[56] References Cited

U.S. PATENT DOCUMENTS

| | | | |
|---|---|---|---|
| 3,458,823 | 7/1969 | Nordahl | 331/11 |
| 3,796,962 | 3/1974 | Hekimian | 331/11 X |
| 3,909,743 | 9/1975 | Margala et al. | 331/11 |
| 4,320,356 | 3/1982 | Perdue | 331/11 |
| 4,580,107 | 4/1986 | Caldwell et al. | 331/10 |
| 4,787,097 | 11/1988 | Rizzo | 331/11 X |

*Primary Examiner*—David Mis
*Attorney, Agent, or Firm*—Emmanuel J. Lobato

[57] ABSTRACT

The invention relates to the synchronization of a frequency-controllable oscillator in a PLL circuit with a carrier. The adjustment of this oscillator to the carrier frequency can be dispensed with in that additionally a frequency discriminator is provided which initially tunes the oscillator in accordance with the frequency difference. The frequency discriminator compares each oscillator frequency with a stable reference frequency which is proximate to the desired frequency and tunes the oscillator until it is in the range of the reference frequency. Subsequently the frequency discriminator is blocked and the further synchronization is taken over by the phase discriminator in the PLL circuit.

11 Claims, 2 Drawing Sheets

CIRCUIT ARRANGEMENT FOR SYNCHRONIZING A FREQUENCY-CONTROLLABLE OSCILLATOR

BACKGROUND OF THE INVENTION

The invention relates to a circuit arrangement for synchronizing a frequency-controllable oscillator with the frequency of a carrier in an input signal, said circuit arrangement comprising a PLL circuit in which the phases of the input signal and a signal derived from the controllable oscillator are compared in a phase discriminator whose output signal, which is dependent on the phase difference, is applied to a control input of the oscillator via a filter.

Circuit arrangements of this type are known, for example, the monolithic integrated circuit TDA 1578 A designed as a stereo decoder for a radio receiver comprises such a circuit. The filter in the PLL circuit is dimensioned in such a way that a capture range of approximately 3% of the input signal frequency (19 kHz) is obtained. On the one hand, this compensates for variations of the free running frequency of the oscillator, caused by variations of the properties of the components and temperature fluctuations of the circuit, and on the other hand the PLL circuit is prevented from locking in on signal components whose frequency differs from the frequency of the pilot signal.

In order that such a small capture range is sufficient, it is necessary to impose strict tolerances on the components which determine the free running frequency of the controlled oscillator, and moreover an adjustment is to be performed, for example by means of a potentiometer.

It is an object of the present invention to realise a circuit arrangement of the type described in the opening paragraph in such a way that an adjustment is not necessary.

SUMMARY OF THE INVENTION

According to the invention this object is realised in that additionally a frequency discriminator arrangement is provided which generates a control signal which is dependent on the difference between the oscillator frequency and a stable reference frequency proximate to the carrier frequency, said control signal being also applied to the control input of the oscillator and controlling said oscillator in the sense that the difference between the reference frequency and the oscillator frequency is reduced, and in that a blocking circuit is provided which blocks the control by the frequency discriminator arrangement when the oscillator frequency is proximate to the reference frequency or is closer to the carrier frequency than the reference frequency.

According to the invention the frequency of the oscillator is thus initially matched with the reference frequency, also when the free running frequency of the oscillator is outside the capture range of the PLL circuit. Subsequently the oscillator is synchronized only with the aid of the phase discriminator in the PLL circuit. If it is realised that very stable reference frequencies generally generated by a quartz oscillator are available anyway in most modern communication apparatus, for example radio receivers, only a frequency discriminator arrangement and a blocking circuit, which can be realised with relatively few components, are required. By means of suitable frequency dividers the reference frequency can be brought so close to the carrier in the input signal that the capture range of the PLL circuit can be essentially reduced so that the non-harmonic distortions being produced in the case of a larger capture range are essentially reduced and the channel separation is maintained.

In a further embodiment according to the invention the free running frequency of the oscillator is chosen to be such that it is above (below) the carrier frequency independent of variations in manufacturing and operation parameters, in that the reference frequency is chosen to be such that it is also above (below) the carrier frequency and at least in the case of control is between the oscillator frequency and the carrier frequency, and in that the blocking circuit blocks the control of the oscillator by the frequency discriminator arrangement when the oscillator frequency has become lower (higher) than the reference frequency. In this further embodiment the frequency discriminator arrangement may have a relatively simple construction because it should only determine whether the oscillator frequency is above (below) the carrier frequency and because it must detune the reference oscillator in one direction only. On the other hand the free running frequency of the oscillator should be relatively far remote from the carrier frequency at which the oscillator oscillates in the synchronized state, in order that the oscillator frequency always remains above or below the carrier frequency independently of temperature fluctuations and production spreads. Thus, the oscillator is generally detuned to a relatively strong extent, which requires precautions in order that the phase difference between the oscillations of the oscillator and the carrier remains small.

In a further embodiment according to the invention, in which it is assumed that an oscillator with stabilized frequency is present, two frequency dividers are provided whose frequency division factors are chosen to be such that a first reference frequency is obtained which is below the carrier frequency and a second reference frequency is obtained which is above the carrier frequency, and in that the blocking circuit is arranged in such a way that the control of the controllable oscillator by the frequency discriminator arrangement is blocked when the first oscillator frequency is between the first and the second reference frequency. By means of the two frequency dividers the two reference frequencies are in this case generated from the frequency of the stabilized oscillator. It is true that in this embodiment the number of components for the frequency discriminator arrangement and for the blocking circuit is doubled, but the controlled oscillator may be dimensioned in such a way that its free running frequency corresponds to the carrier frequency. Dependent on production spreads or temperature fluctuations to which each oscillator was or is subjected, its free running frequency may be between the two reference frequencies, below the first reference frequency or above the second reference frequency, and in any case a "lock-in" of the oscillator is ensured.

The frequency discriminator arrangement may have different structures. A digital embodiment of such a frequency discriminator could comprise a counter which is loaded with a defined count and which, within an oscillation period of the controlled oscillator, is counted down by the oscillations of a stabilized oscillator with an essentially high frequency, the controlled oscillator being tuned until the counter has counted down to the value 0 within a period. As a result, the oscillator would be tuned so far until its frequency would be within two reference frequencies, which frequency depends on the frequency of the stabilized oscillator and the count of the counter. These values are efficiently chosen to be such that the resultant reference frequencies are above and below the carrier frequency.

The above-mentioned digital embodiment, which would also comprise the blocking circuit, is still relatively complicated in the present state of the semiconductor art. Therefore, in a preferred further embodiment of the invention the frequency discriminator circuit comprises at least a frequency-sensitive phase discriminator. Such frequency-sensitive phase detectors are known per se and described in the book "Halbleitertechnik" by Tietze/Schenk (4th edition, pp. 691 etc.). Moreover, such phase detectors form part of several integrated circuits, for example the integrated circuit HEF 4046 B.

As already stated, there are frequency discriminator arrangement which performs a blocking operation when the frequency of the controlled oscillator has reached a given value or a given frequency range. In these circuit arrangement an additional blocking circuit is no longer required. However, other frequency discriminator circuits do not have this facility and in an embodiment of the invention provided for this purpose the frequency discriminator arrangement comprises at least one frequency discriminator having a respective input for the frequency derived from the oscillator signal and for the reference frequency, the frequency discriminator supplying a current of a first polarity when the frequency at the one input is larger than that at the other input and a current of a second polarity when the frequency at the one input is smaller than that at the other input, the output of the frequency discriminator being connected to the control input of the controllable oscillator via a diode.

BRIEF DESCRIPTION OF THE DRAWING

The invention will now be described in greater detail with reference to the accompanying drawings in which.

DESCRIPTION OF THE INVENTION

Figure 1:
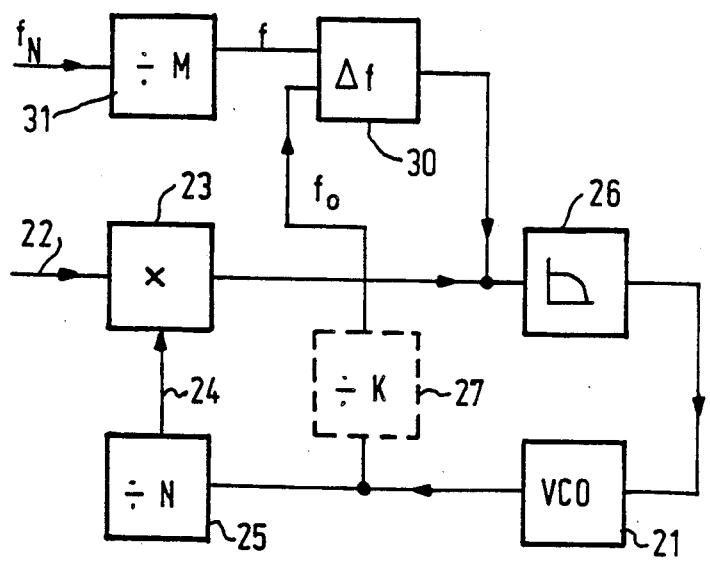
FIG. 1 shows the basic circuit diagram of a circuit according to the invention.

FIG. 1 shows a circuit which is used for synchronizing a frequency-controllable oscillator 21 with a pilot signal (19 kHz) at the signal input 22 and which can be used in a stereo decoder in order to demodulate the so-called difference signals modulated on a suppressed sub-carrier (38 kHz). The input 22 is also an input of a phase discriminator 23 which has a further input 24. The input 24 is connected to the output of a frequency divider 25 in which the frequency of the signal present at the input of this frequency divider, namely the output signal of the controllable oscillator 21, is divided by the factor N. The output signal of the phase discriminator 23, which may be an analog multiplier circuit, is applied to the control input of the frequency-controllable oscillator 21 via a low-pass filter 26. Its frequency varies until the oscillations at the inputs 22 and 24 have the same frequency and substantially the same phase. As hitherto described, a PLL circuit which is known in many variants is concerned.

Additionally, a frequency discriminator circuit 30 is provided which compares the frequency $f_o$ generated by the oscillator 21 and possibly divided by means of a frequency divider 27 with a frequency f which is generated from a stable frequency $f_N$ by means of a frequency divider 31. The frequency $f_N$ can be generated by means of a frequency-stable oscillator, for example a quartz oscillator, which is not shown. A signal which is dependent on the frequency difference is supplied by the frequency discriminator 30 at its output which is connected to the output of the phase discriminator 23. The frequency $f_N$ and possibly the frequency division factor of the frequency divider 31 are chosen to be such that the resultant frequency differs only little from the frequency $f_o$ supplied by the oscillator 21 when synchronized with the pilot signal in the input signal. The output of the frequency discriminator 30, which is connected to the output of the phase discriminator 23, supplies a signal which is dependent on the difference of the frequencies $f_o$. This signal controls the control input of the controllable oscillator 21 via the low-ass filter 26 in such a way that the difference between the frequencies $f_o$ decreases. If the frequency $f_o$ corresponds to the frequency f or has a value around this frequency in a defined range, the frequency discriminator becomes inactive. The oscillator 21 then supplies a frequency which is already close to the frequency of the pilot signal. Although the free running frequency of the controlled oscillator may be relatively remote from the desired frequency, a low-pass filter 26 having a relatively lower cut-off frequency may be used for this reason, which results in a small capture range on the one hand, but also in few phase disturbances on the other hand.

Figure 2:
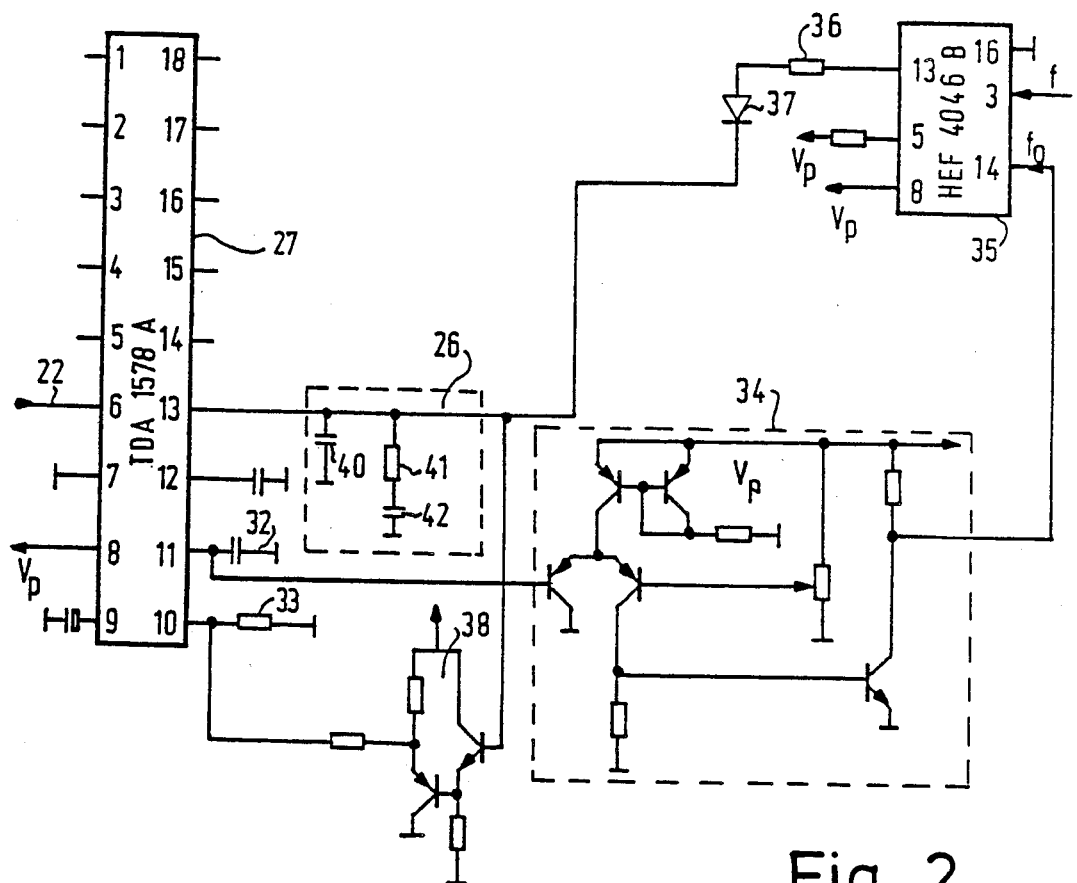
FIG. 2 shows the detailed circuit diagram of a first embodiment composed of integrated circuits.

FIG. 2 shows an embodiment for a stereo decoder realised by means of integrated circuits. The PLL circuit is mainly comprised in the integrated circuit TDA 1578 A whose external wiring is only visible in the drawing with reference to its pins 6 ... 13. The wiring of the pins 1 to 5 and 14 to 18 may correspond to the wiring recommended in the data handbooks. The stereo multiplex signal, which inter alia also includes the pilot signal, is applied to pin 6 of the circuit whose power supply voltage is connected to the terminals 7 and 8. The oscillator in the integrated circuit comprises a current source arrangement which periodically charges and discharges a capacitor 32, the transition between charging and discharging being effected when the voltage at the capacitor has reached an upper value or a lower value, respectively. The value of the charge and discharge current supplied by the current source arrangement is determined by the direct current which flows via pin 10 and hence though the resistor 33 connected to this pin. Thus the frequency of the oscillator can be determined by the RC combination connected to the pins 10 and 11. Although the oscillator frequency is 76 kHz, when it is synchronized with the frequency of the pilot signal (19 kHz), the RC combination 32, 33 was dimensioned in such a way that a free running frequency of 85 kHz is obtained in a normal specimen of the circuit TDA 1578 A at the conventional ambient temperature and with exactly maintained values. This dimensioning is based on the assumption that also in the case of an unfavorable combination of production spreads, component tolerances and temperature fluctuations the desired frequency of 76 kHz represents the lower limit of the free running frequency spread of the oscillator.

The voltage at the capacitor 32, which has a triangular variation, is converted via the amplifier 34 into a symmetrical rectangular voltage and is applied to an integrated circuit 35 of the type HEF 4046 B which comprises a frequency-sensitive phase detector which operates as a frequency discriminator, whose inputs are connected to the pins 3 and 14 and whose output is connected to pin 13. The oscillator frequency $f_o$ is applied to pin 14, while the reference frequency f, which is at 77 kHz, is applied to pin 3. The frequency f is chosen to be such that it has the same value with respect to the nominal frequency as the free running frequency of the oscillator—i.e. in the example assumed above the frequency—and is generally essentially closer to the nominal frequency than the free running frequency. A suitable value for the frequency f is, for example 77 kHz.

Figure 3A:
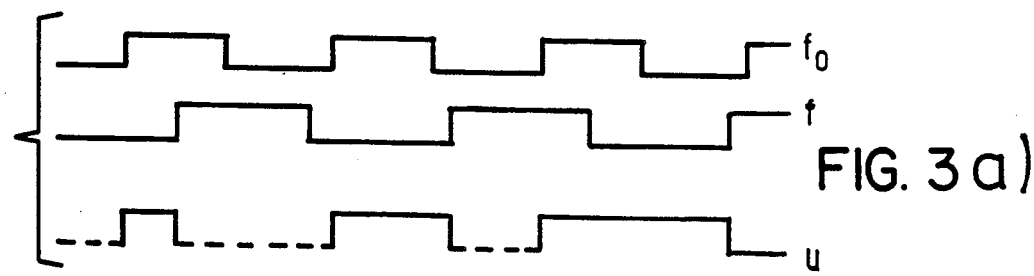
FIGS. 3a and 3b show the variation with time of various signals in a frequency discriminator which can be used according to the invention.

The frequency-sensitive phase detector comprises two switchable current sources at its output, which sources supply currents of opposite polarities. If the oscillator frequency $f_o$ is larger than the reference frequency f, as is shown in FIG. 3a, the one current source is switched on by the positive edges of the oscillator signal and switched off by the positive edge of the reference signal, while the potential u at the output (pin 13) of the phase detector jumps to a positive value; both current sources are switched off in the period between the positive edge of the reference signal and the positive edge of the oscillator signal.

Figure 3B:
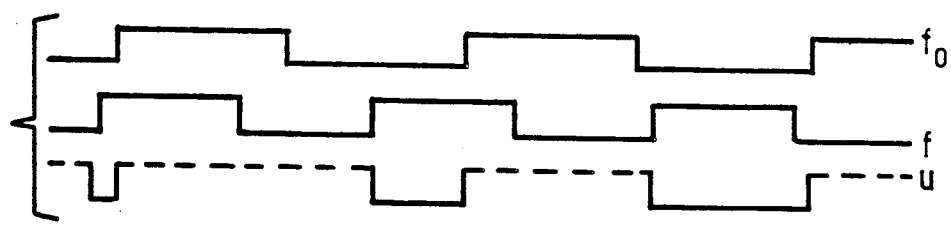

If the oscillator frequency $f_o$ is lower than the reference frequency (compare FIG. 3b), the other current source is switched on by the positive edges of the reference signal and switched off by the positive edges of the oscillator signal, while the two current sources are switched off again in the intervals. The frequency-sensitive phase detector 35 thus supplies at its output a plusatory direct current whose polarity is positive if $f_o$ is larger than f, and negative if $f_o$ is smaller than f. The output is connected via a resistor 36 of 330 kOhm and a diode, which only passes the positive current pulses, to the input of an impedance transformer 38 which has a high-ohmic input and a low-homic output, which is connected via a resistor 39, likewise of 330 kOhm to the pin 10 of the circuit 27, which pin constitutes the control input of the controllable oscillator in said circuit. The current flowing via pin 10 to the external resistor 33 is reduced in accordance with the current supplied by the impedance transformer 38 so that also the oscillator frequency decreases. This control process is continued until the oscillator frequency $f_o$ corresponds to the reference frequency f. Subsequently the phase detector is inactive due to the diode 37.

If the input signal at the input 22 (=pin 6) comprises a pilot signal, the phase discriminator in the circuit 27 supplies a control signal at pin 13, which signal is applied to the impedance transformer via the low-pass filter 26 and which further reduces the oscillator frequency until a frequency of 76 kHz corresponding to the four-fold value of the pilot signal frquecny is attained; then the PLL circuit is locked in.

The low-pass filter 26 not only filters the output signal of the phase discriminator in the circuit 27 but also the output signal of the frequency-sensitive phase detector 35. It comprises two parallel-arranged branches one of which consists of a capacitor 40 of 220 nF and the other one consists of the series circuit of a resistor 41 of 22 kOhm and a capacitor 42 of 150 nF. The cut-off frequency of this low-pass filter is thus essentially lower than is recommended in the data handbook for the integrated circuit TDR 1578 A, because the capture range can be relatively small due to the predetermined small difference between the reference frequency f and the desired frequency.

A relatively large difference may exist between the free running frequency of the oscillator (85 kHz, but essentially more in the case of unfavorable coincidence of temperature fluctuations and production spreads) and the frequency with which the oscillator is to be synchronized (76 kHz). As a result, there is a relatively large phase shift in the locked-in state of the PLL circuit between the pilot signal present at the input 22 and the 19 kHz signal derived by frequency division from the 76 kHz output signal of the oscillator, which phase shift may lead to a deterioration of the channel separation of the stereo decoder which is fed with the 19 kHz signal. This phase error can, however, be reduced by increasing the loop gain in the PLL circuit. The impedance transformer 38 is used for this purpose.

Figure 4:
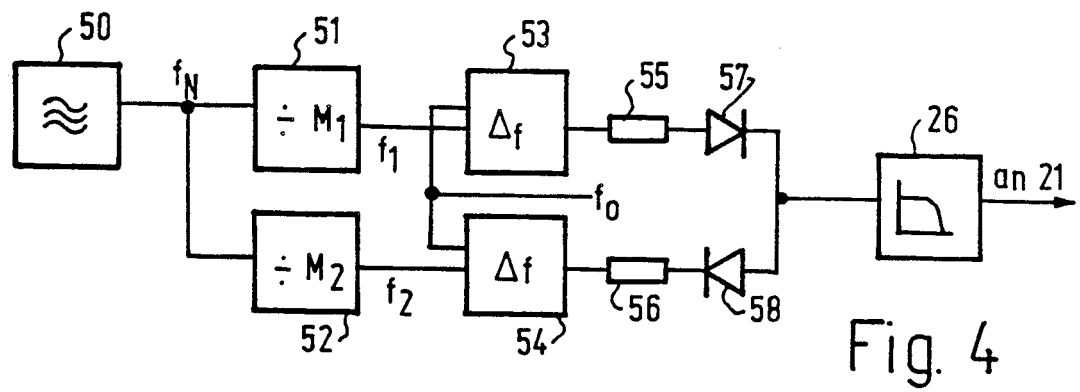
FIG. 4 shows a second embodiment.

FIG. 4 shows an embodiment in which the components 30 and 31 of FIG. 1 are replaced by the components 50 ... 48. The reference numeral 50 denotes an oscillator having a stable frequency, for example a quartz oscillator. The oscillator signal with the frequency $f_N$ is applied to the inputs of two frequency dividers 51 and 52. The frequency dividers 51 and 52 have different frequency division factors which are chosen to be such that a first reference frequency $f_1$ results which is below the carrier frequency, and (at the output of the frequency divider 52) a second reference frequency $f_2$, which is just above the reference frequency. If, for example the oscillator frequency in the synchronized state should be 76 kHz and if the frequency $f_N$ of the oscillator 50 is 4 MHz, the frequency divider 51 should have a frequency division factor of 53 and the frequency divider 52 should have a frequency division factor of 52. Reference frequencies $f_1$ of 75.5 kHz and $f_2$ of 76.9 kHz would result therefrom. The two reference frequencies thus constitute a frequency window within which the desired oscillator frequency is located.

Each of the two frequency dividers is coupled to one of the frequency-sensitive phase detectors 53 and 54 which may have the same structure as the frequency detector 35 described with reference to FIG. 2. The reference frequencies $F_1$ and $f_2$ are applied to the first input of the detectors 53 and 54, respectively, whose second inputs convey the oscillator frequency $f_o$. The output of the phase detector 53 is connected to the low-pass filter 26 of the PLL circuit, which is not further shown, via the series circuit of a resistor 55 and a diode 57. The output of the phase detector 54 is connected to the low-pass filter 26, likewise via the series circuit of a resistor 56 and a diode 58, but the diode 58 (viewed from the low-pass filter 26) has a polarity in a direction opposite to that of diode 57.

The circuit according to FIg 4 operates as follows, when the free running frequency $f_o$ of the oscillator is below the reference frequency $f_1$: the two detectors 53 and 54 supply current pulses with a positive polarity, while only the current pulses supplied by detector 53 can reach the input of the low-pass filter 26 because the positive current pulses of the detector 54 are suppressed by the diode 58. As a result a voltage is obtained at the output of the filter, which voltage tunes the controlled oscillator 21, which is not shown in FIG. 4, towards the higher frequencies. If the oscillator frequency $f_o$ has reached or exceeded the value of the reference frequency $f_1$, the polarity of the current pulses do not become active due to the diode 57. In this state, in which the output signals of the two detectors 53 and 54 are blocked by the subsequently arranged diodes 57 and 58, the oscillator frequency is between the reference frequencies $f_1$ and $f_2$ and the controlled oscillator is subsequently brought to the desired value only by means of the PLL circuit, which is not further shown in FIG. 4.

If the frequency $f_o$ of the oscillator is initially above the reference frequency $f_2$, the two detectors 53 and 54 supply current pulses with a negative polarity; however, the current pulses of the detector 53 are suppressed by the diode 57. Via the low-pass filter 26, the negative current pulses cause the controlled oscillator 21 to be tuned towards lower frequencies until it has reached the value $f_2$. Then the polarity of the signals supplied by detector 54 is reversed, but these signals are now suppressed by the diode 58. The phase detectors 53 and 54 are thus both inactive and the controlled oscillator is further detuned by means of the PLL circuit.

If the free running frequency $f_o$ is already from the start between the two values $f_1$ and $f_2$, the oscillator is tuned only by means of the PLL circuit.

The advantage of the circuit according to FIG. 4, as compared with the circuit according to FIG. 2 is that the nominal value of the free running frequency of the oscillator may be identical to the frequency of the oscillator in the synchronized state. In spite of production spreads and temperature fluctuations the difference between the frequency of the oscillator in the synchronized state and the free running frequency is generally smaller than in a circuit according to FIG. 2 so that smaller phase errors are the result. However, the number of components for the frequency divider, phase detector and blocking circuit is twice as high as in the circuit according to FIG. 2.

Figure 5:
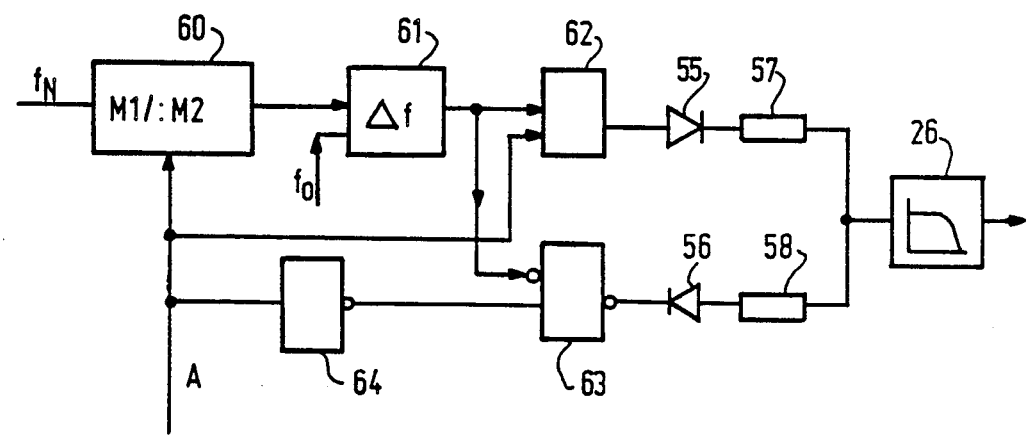
FIG. 5 shows a third embodiment.

A circuit having the same advantages as the circuit according to FIG. 2 and requiring fewer components is shown in FIG. 5. The terminals of the series circuit 55, 56, 58 are connected via AND gates 62 and 63, respectively, to the output of a frequency-sensitive phase detector 61 which may have the same structure as the detector 35 in FIG. 2; the input of this detector is connected to the output of a switchable frequency divider 60 whose input receives the stable frequency $f_N$. The output of the AND gate 63 is inverted as well as its input connected to the output of the detector 61. Pulses having a positive polarity can thus reach the low-pass filter 26 via the resistor-diode path 55, 57 and pulses having a negative polarity can reach the filter via the diode-resistor path 56, 58—if an appropriate signal is present at the second input of the prearranged AND gates 62 and 63. This signal A, which determines the frequency division factor of the circuit 60, is directly applied to the second input of the AND gate 62 and to the second input of the AND gate 63 via an inverter 64.

The circuit operates as follows: for A=1 the frequency division factor $M_1$ is used so that the output frequency of the frequency divider 60 is $f_1$. If the oscillator frequency of the frequency $f_1$, the output pulses of the detector 61 have a positive polarity and reach the filter 26 via the then enabled AND gate 62, the diode 55 and the resistor 57. This raises the oscillator frequency until the frequency $f_o$ exceeds the frequency $f_1$. The negative pulses then occurring are blocked by the diode 55 and cannot reach the diode 56 because the AND gate 63 is then blocked.

If the signal A has the value "0", the output signal of the frequency divider circuit 60 has the value $f_2$. If the oscillator frequency $f_o$ is above the frequency $f_2$, the detector 61 supplies pulses with a negative polarity which can reach the low-pass filter 26 via the then enabled AND gate 63 and the diode 56 and the resistor 58, while the output signal of the filter detunes the voltage-controlled oscillator 21 (FIG. 1) not further shown until the oscillator frequency $f_o$ comes below the value $f_2$. The output pulses then acquire a positive polarity which would be suppressed by the diode 56 and which cannot reach the diode 55 because the AND gate 62 is blocked.

Thus, if the oscillator frequency $f_o$ is below the lower reference frequency $f_1$ or above the higher reference frequency $f_2$, the oscillator is detuned until the oscillator frequency is in the range between $f_1$ and $f_2$. Subsequently the circuit becomes inactive.

If at the signal A="0" the frequency $f_0$ is lower than $f_1$ or at the signal A="1" the frequency $f_0$ is higher than $f_2$, the circuit is not active either. To achieve the desired detuning of the oscillator in this case, the signal A must be inverted. This can be effected in that the signal is periodically inverted with a sufficiently large period. However, it is alternatively possible to provide a logic circuit, which is not shown in FIG. 5, which inverts the polarity of the signal A whenever no (positive or negative) pulses occur at the junction point between resistor 57 and 58.

The use of the invention with reference to a PLL stereo decoder has been described hereinbefore, but the invention is not limited thereto. It may also be used in decoding circuits for traffic broadcasts or radio data systems. Generally, it is applicable in PLL demodulator circuits in which the oscillator is to be synchronized with a known carrier frequency.

We claim:

1. A circuit arrangement for synchronizing a frequency-controllable oscillator with the frequency of a carrier in an input signal, said circuit arrangement comprising a PLL circuit in which the phases of the input signal and a signal derived from the controllable oscillator are compared in a phase discriminator whose output signal, which is dependent on the phase difference, is applied to a control input of the oscillator via a filter, characterized in that:

a frequency discriminator arrangement is provided which generates a control signal which is dependent on the difference between the oscillator frequency ($f_o$) and a stable reference frequency (f) proximate to the carrier frequency, said control signal being also applied to the control input of the oscillator and controlling said oscillator in the sense that the difference between the reference frequency and the oscillator frequency is reduced, a blocking circuit (57, 58) is provided which blocks the control by the frequency discriminator arrangement when the oscillator frequency ($f_o$) is proximate to the reference frequency (f) or is closer to the carrier frequency than the reference frequency; and the free running frequency of the oscillator is chosen to be such that it is above or below the carrier frequency independent of variations in manufacturing and operation parameters, the reference frequency is chosen to be such that it is also above or below the carrier frequency and at least in the case of control is between the oscillator frequency and the carrier frequency, and the blocking circuit blocks the control of the oscillator by the frequency discriminator arrangement when the oscillator frequency has become lower or higher than the reference frequency.

2. A circuit arrangement as claimed in claim 1, characterized in that the reference frequency is generated by means of a reference oscillator.

3. A circuit arrangement as claimed in claim 2, characterized in that the frequency of the reference oscillator is higher than the carrier freqnecy and in that the reference frequency is derived from the frequency of the reference oscillator by means of at least one frequency divider (31, 51, 53).

4. A circuit arrangement as claimed in claim 3, characterized in that two frequency dividers (51, 52) are provided whose frequency division factors are chosen to be such that a first reference frequency ($f_1$) is obtained which is below the carrier frequency and a second reference frequency ($f_2$) is obtained which is above the carrier frequency, and in that the blocking circuit (57, 58) is arranged in such a way that the control of the controllable oscillator by the frequency discriminator arrangement (53, 54) is blocked when the oscillator frequency ($f_o$) is between the first and the second reference frequency ($f_1$, $f_2$).

5. A circuit arrangement as claimed in claim 4, characterized in that the frequency discriminator arrangement comprises two similarly constructed frequency discriminators (53, 54) each having two inputs for the frequencies to be compared, in that the oscillator signal is applied to the first input of the frequency discriminators (53 and 54), in that the reference frequencies ($f_1$ and $f_2$) are applied to the second input of each one of the two detectors and in that the blocking circuit (57, 58) blocks the one frequency discriminator (53) when the oscillator frequency ($f_o$) is above the first reference frequency ($f_1$) and blocks the other frequency discriminator (54) when the oscillator frequency is below the second reference frequency.

6. A circuit arrangement as claimed in claim 1, characterized in that the frequency discriminator circuit comprises at least one frequency-sensitive phase discriminator.

7. A circuit arrangement as claimed in claim 1, characterized in that the frequency discriminator arrangement comprises at least one frequency discriminator (35, 53, 54) each having an input for the frequency ($f_o$) derived from the oscillator signal and for the reference frequency (f), in that the frequency discriminator supplies a current of a first polarity when the frequency at the one input is larger than that at the other input, and a current of a second polarity when the frequency at the one input is smaller than that at the other input, and in that the output of the frequency discriminator is connected to a control input of the controllable oscillator at least via a diode (36, 57, 58).

8. A circuit arrangement as claimed in claim 7, characterized in that an upper ($f_1$) and a lower ($f_2$) reference frequency is derived from a stabilized frequency ($f_N$) by means of a frequency divider (60) having a switchable frequency division factor, the lower reference frequency being lower than and the upper reference frequency being higher than the carrier frequency ($f_o$).

9. A circuit arrangement as claimed in claim 1, in which a control current for influencing the frequency is applied to the control input of the controllable oscillator and in which the phase discriminator has a high output resistance, characterized in that the output signal of the phase discriminator (27) and the frequency discriminator arrangement (35) is applied to the control input via an amplifier (38) having a high-ohmic input and a low-ohmic output.

10. A circuit arrangement as claimed in claim 1, characterized by its use in a radio receiver.

11. A circuit arrangement as claimed in claim 9, characterized by its use in a stereo decoder.

* * * * *